United States Patent
Harada

(10) Patent No.: US 10,348,995 B2
(45) Date of Patent: Jul. 9, 2019

(54) IMAGE SENSOR AND IMAGING APPARATUS

(71) Applicant: SONY SEMICONDUCTOR SOLUTIONS CORPORATION, Kanagawa (JP)

(72) Inventor: Kouichi Harada, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 90 days.

(21) Appl. No.: 15/520,470

(22) PCT Filed: Aug. 3, 2015

(86) PCT No.: PCT/JP2015/071905
§ 371 (c)(1),
(2) Date: Apr. 20, 2017

(87) PCT Pub. No.: WO2016/067692
PCT Pub. Date: May 6, 2016

(65) Prior Publication Data
US 2018/0309948 A1    Oct. 25, 2018

(30) Foreign Application Priority Data

Oct. 30, 2014 (JP) .................................. 2014-221240

(51) Int. Cl.
*H03M 1/12* (2006.01)
*H04N 5/353* (2011.01)
(Continued)

(52) U.S. Cl.
CPC ....... *H04N 5/378* (2013.01); *H01L 27/14612* (2013.01); *H04N 5/353* (2013.01); *H04N 5/3745* (2013.01); *H03M 1/12* (2013.01)

(58) Field of Classification Search
CPC ...... H04N 5/378; H04N 5/353; H04N 5/3745; H01L 27/14612; H03M 1/12
See application file for complete search history.

(56) References Cited

U.S. PATENT DOCUMENTS

2003/0151686 A1* 8/2003 Koyama ................ H04N 5/367
348/304
2005/0068436 A1* 3/2005 Fraenkel .............. H04N 5/2178
348/294
(Continued)

FOREIGN PATENT DOCUMENTS

JP    07-067043 A    3/1995
JP    2002-232291 A    8/2002
(Continued)

*Primary Examiner* — Amy R Hsu
(74) *Attorney, Agent, or Firm* — Chip Law Group

(57) ABSTRACT

Presence or absence of a photon is accurately detected in an image sensor with a simple configuration. A pixel circuit generates as an input voltage a signal voltage by photoelectrically converting light when the light is incident, and generates as the input voltage a predetermined reset voltage when light is not incident. A capacitor retains the predetermined reset voltage as a retained voltage. An amplification comparator amplifies a voltage difference between the input voltage and the retained voltage. A detection comparator outputs a result of determining whether or not the amplified voltage difference is higher than a predetermined value, as a detection signal indicating detected presence or absence of light incidence.

12 Claims, 9 Drawing Sheets

(51) Int. Cl.
    *H04N 5/378* (2011.01)
    *H01L 27/146* (2006.01)
    *H04N 5/3745* (2011.01)

(56) References Cited

U.S. PATENT DOCUMENTS

| | | | | |
|---|---|---|---|---|
| 2006/0157643 A1* | 7/2006 | Bamji | ................. | G01C 3/06 |
| | | | | 250/208.1 |
| 2013/0214125 A1* | 8/2013 | Solhusvik | ......... | H01L 27/14612 |
| | | | | 250/208.1 |
| 2015/0189209 A1* | 7/2015 | Yang | ................. | H04N 5/378 |
| | | | | 348/300 |

FOREIGN PATENT DOCUMENTS

| JP | 2011-071958 A | 4/2011 |
|---|---|---|
| JP | 2012-235265 A | 11/2012 |
| JP | 2013-070372 A | 4/2013 |

* cited by examiner

FIG.7

| PIXEL SIGNAL | CONTROL SIGNAL | AMPLIFICATION COMPARATOR (GAIN : 50, INPUT OFFSET : $V_{ofs1}$) | | DETECTION COMPARATOR (GAIN : 50, INPUT OFFSET : $0.025\pm0.001V$) | |
|---|---|---|---|---|---|
| | | $V_{in1+}-V_{in1-}$ | $V_{out1}$ | $V_{in2+}-V_{in2-}$ | $V_{out2}$ |
| RESET VOLTAGE $V_{rst}$ ($\fallingdotseq 1V$) | HIGH LEVEL | $V_{rst}-(V_{rst}+V_{ofs1})$ $=-V_{ofs1}$ | $V_{rst}+V_{ofs1}\fallingdotseq 1V$ | $V_{rst}+V_{ofs1}-$ $(V_{rst}+V_{ofs1})$ $=0V$ | HIGH LEVEL |
| SIGNAL VOLTAGE $V_{sig}$ ($V_{rst}-0.001V$) | LOW LEVEL | $V_{sig}-(V_{rst}+V_{ofs1})$ $=-V_{ofl}-0.001V$ | $(-0.001)\times 50+1$ $=0.95V$ | $V_{out1}-(V_{rst}+V_{ofs1})$ $\fallingdotseq -0.05V$ | LOW LEVEL |

IMAGE SENSOR AND IMAGING APPARATUS

CROSS REFERENCE TO RELATED APPLICATIONS

This application is a U.S. National Phase of International Patent Application No. PCT/JP2015/071905 filed on Aug. 3, 2015, which claims priority benefit of Japanese Patent Application No. JP 2014-221240 filed in the Japan Patent Office on Oct. 30, 2014. Each of the above-referenced applications is hereby incorporated herein by reference in its entirety.

TECHNICAL FIELD

The present technology relates to an image sensor and an imaging apparatus. In detail, the present technology relates to an image sensor and an imaging apparatus for detecting presence or absence of a photon.

BACKGROUND ART

From the past, an image sensor having such a high sensitivity as to be able to detect one photon is used in an imaging apparatus, a radiation counting device, and the like (see, for example, patent literature 1). In this image sensor, pixels having very high conversion efficiency and sense circuits having high sensitivity are stacked on a one to one basis, thereby making an analog-to-digital (A/D) converter for each pixel unnecessary.

CITATION LIST

Patent Literature

Patent Literature 1: JP 2011-71958A

DISCLOSURE OF INVENTION

Technical Problem

In the image sensor described above, even if the conversion efficiency can be set to 1 mV/e- for example, it is necessary to make a 1/0 determination on a signal having a peak-to-peak value of approximately 1 mV. However, in a sense circuit used in the image sensor described above, it is necessary to input the signal by capacitive coupling, and there is a problem that the input voltage is lowered. Also, in the image sensor described above, it is necessary to generate an offset voltage OFFSET having a peak-to-peak value of approximately 0.5 mV as illustrated in FIG. 9, but it was difficult to input a pulse having a peak-to-peak value of approximately 0.5 mV to all pixels in common.

The present technology has been developed in view of such a situation and aims to accurately detect presence or absence of a photon in an image sensor with a simple configuration.

Solution to Problem

The present technology has been made in order to solve the above problems. A first aspect of the present technology is an image sensor including: a pixel circuit that generates as an input voltage a signal voltage by photoelectrically converting light when the light is incident, and generates as the input voltage a predetermined reset voltage when light is not incident; a capacitor that retains the predetermined reset voltage as a retained voltage; an amplification comparator that amplifies a voltage difference between the input voltage and the retained voltage; and a detection comparator that outputs a result of determining whether or not the amplified voltage difference is higher than a predetermined value, as a detection signal indicating detected presence or absence of light incidence. This brings about an effect that a result of determining whether or not the voltage difference obtained by amplifying the difference between the input voltage and the retained voltage is higher than the predetermined value is output as a detection signal.

In the first aspect, a control unit that causes the capacitor to retain the predetermined reset voltage when light is not incident may be further included. This brings about an effect that, when light is not incident, the reset voltage is retained in the capacitor.

In the first aspect, the amplification comparator may amplify a voltage difference between terminal voltages of a pixel circuit side input terminal connected to the pixel circuit and a capacitor side input terminal connected to the capacitor, and output a voltage corresponding to the amplified voltage difference from an output terminal, and the control unit may cause the capacitor to retain the predetermined reset voltage by interterminal short-circuiting of the capacitor side input terminal and the output terminal. This brings about an effect that interterminal short-circuiting between the capacitor side input terminal and the output terminal causes the reset voltage to be retained in the capacitor.

In the first aspect, the amplification comparator may amplify the voltage difference between the input voltage and the retained voltage to generate a comparison target voltage corresponding to the amplified voltage difference, and the detection comparator may amplify a voltage obtained by adding a predetermined input offset voltage to a voltage difference between the retained voltage and the comparison target voltage and output the amplified voltage as the detection signal. This brings about an effect that the detection signal obtained by amplifying the voltage obtained by adding the predetermined input offset voltage to the voltage difference between the retained voltage and the comparison target voltage is output.

In the first aspect, the amplification comparator may amplify the voltage difference between the input voltage and the retained voltage with a predetermined gain, and the input offset voltage may be approximately equal to a half of a value obtained by amplifying a voltage difference between the reset voltage and the signal voltage with the predetermined gain. This brings about an effect that the input offset approximately equal to the half of the value obtained by amplifying the voltage difference between the reset voltage and the signal voltage by the predetermined gain is added.

In the first aspect, the detection comparator may include a pair of differential transistors that amplify the voltage obtained by adding the predetermined input offset voltage to the voltage difference between the retained voltage and the comparison target voltage. This brings about an effect that the voltage obtained by adding the predetermined input offset voltage to the voltage difference between the retained voltage and the comparison target voltage is amplified by the pair of differential transistors.

In the first aspect, the input offset voltage may include an adjustment offset component corresponding to a difference between threshold voltages of the pair of differential transistors. This brings about an effect that the input offset voltage including the adjustment offset component corresponding to the difference between the threshold voltages of the pair of differential transistors is added.

In the first aspect, the input offset voltage may include an adjustment offset component corresponding to a difference between gate widths of the pair of differential transistors. This brings about an effect that the input offset voltage including the adjustment offset component corresponding to the difference between the gate widths of the pair of differential transistors is added.

In the first aspect, the input offset voltage may include an adjustment offset component corresponding to a difference between gate lengths of the pair of differential transistors. This brings about an effect that the input offset voltage including the adjustment offset component corresponding to the difference between the gate lengths of the pair of differential transistors is added.

In the first aspect, the input offset voltage may include an adjustment offset component corresponding to a difference between film thicknesses of gate oxide films of the pair of differential transistors. This brings about an effect that the input offset voltage including the adjustment offset component corresponding to the difference between the film thicknesses of the gate oxide films of the pair of differential transistors is added.

In the first aspect, the amplification comparator may be provided with a pair of differential transistors connected to a pixel circuit side input terminal connected to the pixel circuit and a capacitor side input terminal connected to the capacitor, and the image sensor may further include a first buffer amplifier that expands a dynamic range of the differential transistor connected to the capacitor side input terminal and reduces an impedance of an output terminal of the amplification comparator. This brings about an effect that the dynamic range of the differential transistor of the capacitor side is expanded, and the impedance of the output terminal of the amplification comparator is reduced.

In the first aspect, a second buffer amplifier that reduces an impedance of an output terminal of the detection comparator may be further included. This brings about an effect that the impedance of the output terminal of the detection comparator is reduced.

A second aspect of the present technology is an imaging apparatus including: a pixel circuit that generates as an input voltage a signal voltage by photoelectrically converting light when the light is incident, and generates as the input voltage a predetermined reset voltage when light is not incident; a capacitor that retains the predetermined reset voltage as a retained voltage; an amplification comparator that amplifies a voltage difference between the input voltage and the retained voltage; a detection comparator that outputs a result of determining whether or not the amplified voltage difference is higher than a predetermined value, as a detection signal indicating detected presence or absence of light incidence; and a signal processing circuit that processes the detection signal. This brings about an effect that a result of determining whether or not the voltage difference obtained by amplifying the difference between the input voltage and the retained voltage is higher than the predetermined value is output as a detection signal.

Advantageous Effects of Invention

According to the present technology, it is possible to obtain an excellent effect that presence or absence of a photon can be accurately detected in the image sensor with a simple configuration. Note that effects described herein are not necessarily limitative, and any of effects described in the present disclosure may be exhibited.

BRIEF DESCRIPTION OF DRAWINGS

FIG. 7 is a diagram illustrating an example of input and output voltages of an amplification comparator and a detection comparator in the first embodiment.

MODE(S) FOR CARRYING OUT THE INVENTION

In the following, a mode for carrying out the present technology (hereinafter referred to as an embodiment) will be described. The description will be made in the following order.

1. First Embodiment (an example in which a photon is detected by amplifying a voltage difference between reset voltage and signal voltage)

2. Second Embodiment (an example in which a photon is detected by amplifying a voltage difference between reset voltage and signal voltage, and a dynamic range of a differential transistor of a capacitor-side input terminal side is expanded, and an output impedance is reduced)

1. First Embodiment

[Configuration Example of Imaging Apparatus]

Figure 1:
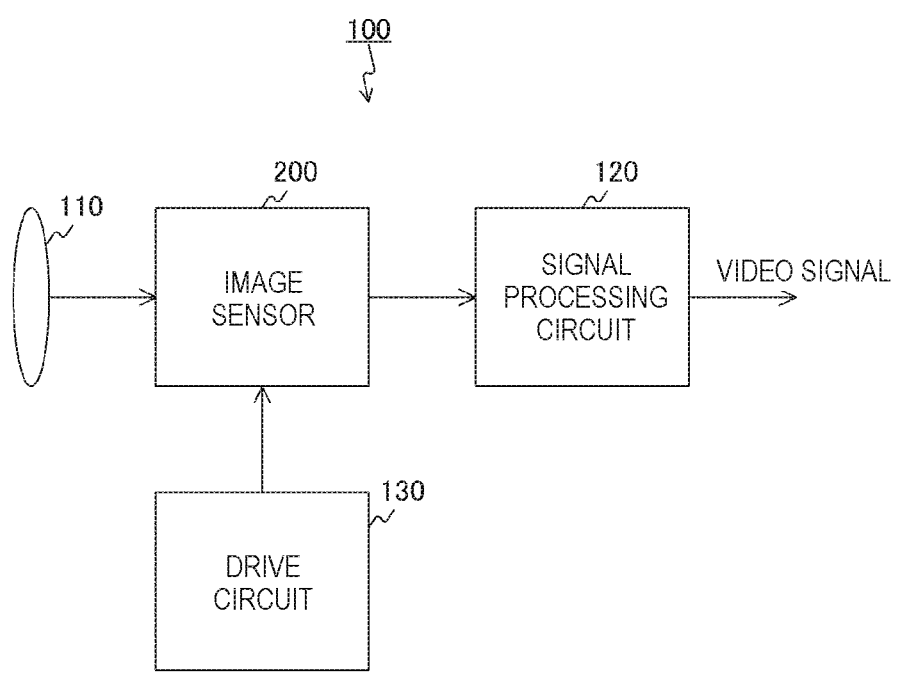
FIG. 1 is a block diagram illustrating a configuration example of an imaging apparatus in a first embodiment.

FIG. 1 is an example of an overall view of an imaging apparatus 100 according to a first embodiment. As illustrated in FIG. 1, the imaging apparatus 100 includes an image sensor 200. Also, the imaging apparatus 100 includes an optical system that directs incident light to a pixel region of this image sensor 200 (forms a subject image), e.g. a lens 110 that causes the incident light (image light) to form an image on an imaging surface. Furthermore, the imaging apparatus 100 includes a driving circuit 130 that drives the image sensor 200, and a signal processing circuit 120 that processes an output signal of the image sensor 200.

The driving circuit 130 includes a timing generator (not depicted) for generating various timing signals including a start pulse and a clock pulse for driving a circuit in the image sensor 200, and drives the image sensor 200 with a predetermined timing signal.

Also, the signal processing circuit 120 performs predetermined signal processing to an output signal of the image sensor 200. An image signal processed by the signal processing circuit 120 is recorded in a recording medium such as a memory, for example. The image information recorded in the recording medium is hard copied by a printer or the like. Also, the image signal processed by the signal processing circuit 120 is displayed as a moving image on a monitor composed of a liquid crystal display or the like.

[Configuration Example of Image Sensor]

Figure 2:
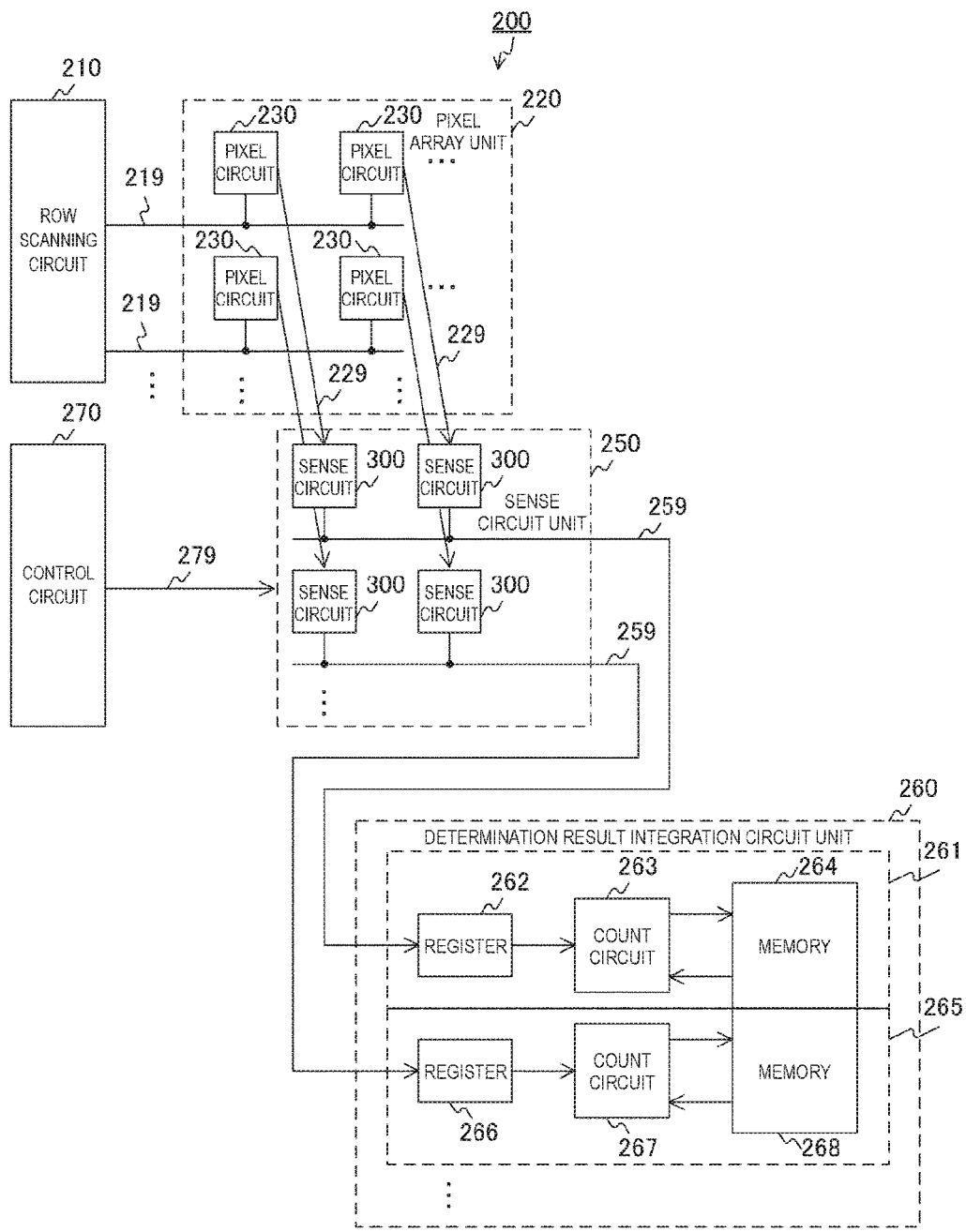
FIG. 2 is a block diagram illustrating a configuration example of an image sensor in the first embodiment.

FIG. 2 is a block diagram illustrating one configuration example of the image sensor 200 in the first embodiment. The image sensor 200 includes a row scanning circuit 210, a pixel array unit 220, a sense circuit unit 250, a determination result integration circuit unit 260, and a control circuit 270.

The row scanning circuit 210 sequentially exposes each row to light, in accordance with the control of the driving circuit 130.

In the pixel array unit 220, a plurality of pixel circuits 230 are arranged in a matrix form in a row direction and a column direction. Each pixel circuit has a photoelectric conversion element and has a function for outputting an electric signal in accordance with incidence of photons. The pixel array unit 220 is formed on a first semiconductor substrate, for example.

The sense circuit unit 250 is formed on a second semiconductor substrate different from the first semiconductor substrate. In the sense circuit unit 250, a plurality of sense circuits 300 are arranged in a matrix form in the row direction and the column direction for example, in a one-to-one correspondence with the plurality of pixel circuits 230 arranged in a matrix in the pixel array unit 220. Each sense circuit 300 has a function for receiving a signal from the pixel circuit 230 and making a binary determination of whether or not photon is incident on the pixel circuit 230 in a predetermined period.

Then, the first semiconductor substrate and the second semiconductor substrate are stacked. For example, the plurality of pixel circuits 230 formed on the first semiconductor substrate and the plurality of sense circuits 300 formed on the second semiconductor substrate are stacked so as to face each other on a one-to-one basis. The opposing pixel circuits 230 and sense circuits 300 are connected by respective output signal lines 229. In the sense circuit unit 250, outputs of the sense circuits 300 arranged in the same row are connected to a common transfer line 259.

The control circuit 270 controls the sense circuit unit 250 to determine presence or absence of incidence of a photon.

The determination result integration circuit unit 260 has a function for integrating determination results of the sense circuits 300 a plurality of times for each pixel to generate two-dimensional imaging data with gradation. In the determination result integration circuit unit 260, determination result integration circuits 261, 265, . . . are arranged corresponding to the row arrangement of the sense circuits 300 in the sense circuit unit 250.

The determination result integration circuit 261 includes a register 262 for retaining a determination value transferred through the transfer line 259 of a 0th row, a count circuit 263 for counting the value retained in the register 262, and a memory 264 for storing a count result of the count circuit 263. Also, the determination result integration circuit 265 includes a register 266 for retaining a determination value transferred through the transfer line 259 of a first row, a count circuit 267 for counting the value retained in the register 266, and a memory 268 for storing a count result of the count circuit 267.

[Configuration Example of Pixel Circuit]

Figure 3:
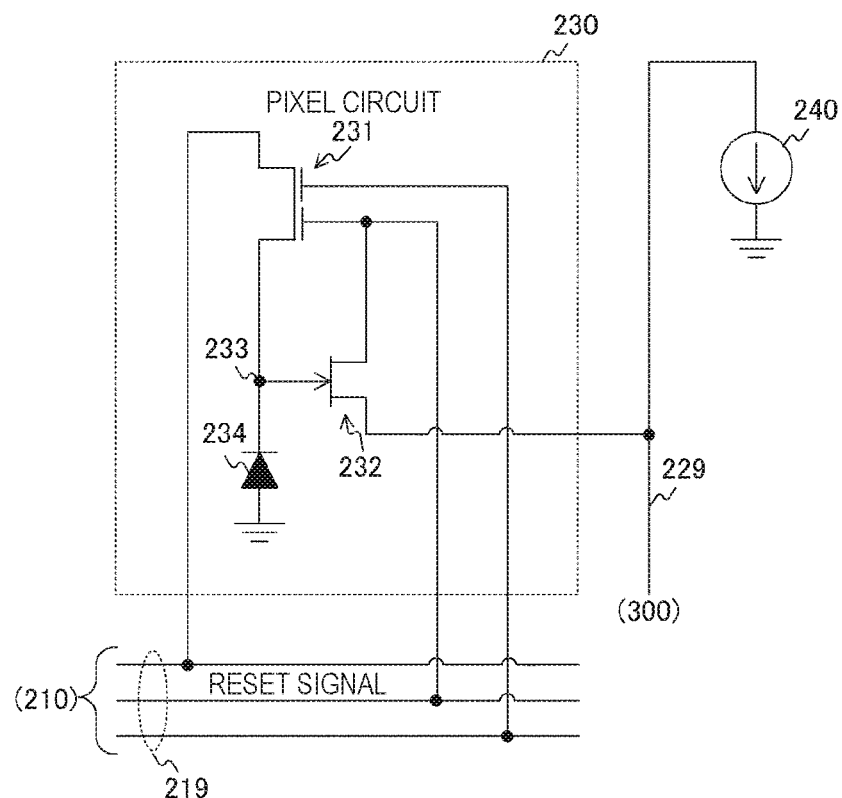
FIG. 3 is a circuit diagram illustrating an example of a pixel circuit in the first embodiment.

FIG. 3 is a circuit diagram illustrating one configuration example of a pixel circuit 230 in the first embodiment. The pixel circuit 230 includes a reset transistor 231, a detection transistor 232, an electric charge accumulation portion 233, and a photoelectric conversion portion 234. As the reset transistor 231, an N-type metal-oxide-semiconductor field-effect transistor (MOSFET) is used, for example. As the detection transistor 232, an N-type junction field-effect transistor (JFET) is used, for example. Like this, in a charge modulation device (CMD) in which an FD is not provided in a pixel, it is possible to eliminate the dark current of the FD and to increase the conversion efficiency of converting the electric charge to a voltage to a higher value than the image sensor equipped with the FD. Also, in the CMD, the electric charge generated by light reception is retained unless reset, and even when the electric charge is read out as a signal, the electric charge is retained in an accumulated state without disappearing. Thereby, so-called nondestructive readout is enabled.

A ground potential is applied to an anode of the photoelectric conversion portion 234, and a cathode is connected to the electric charge accumulation portion 233. Also, a gate of the detection transistor 232 is connected to the electric charge accumulation portion 233, and a source is connected to the sense circuit unit 250 and a constant current source 240, and a drain functions as a part of gates of the reset transistor 231 and is connected to the row scanning circuit 210. Also, a source of the reset transistor 231 is connected to the electric charge accumulation portion 233, and a drain is connected to the row scanning circuit 210. Also, the reset transistor 231 has two gates, one of which functions also as a drain of the detection transistor 232 and the other is connected to the row scanning circuit 210. In the following, one of the two gates of the reset transistor 231 connected to the row scanning circuit 210 will be referred to as "reset gate", and the drain will be referred to as "reset drain".

The photoelectric conversion portion 234 converts light to electric charge. The electric charge accumulation portion 233 accumulates the photoelectrically converted electric charge and supplies a signal voltage corresponding to the accumulated electric charge amount to the detection transistor 232.

The detection transistor 232 controls a source voltage in accordance with the signal voltage from the electric charge accumulation portion 233. The detection transistor 232 supplies a pixel signal of this source voltage to the sense circuit 300.

The reset transistor 231 sets the electric charge amount of the electric charge accumulation portion 233 to an initial value in accordance with the control of the row scanning circuit 210.

When resetting the electric charge amount, the row scanning circuit 210 supplies a high level reset signal to the reset drain and the reset gate and the drain of the detection transistor 232, and when accumulating the electric charge (that is, exposing to light), supplies a low level reset signal. For example, at the timing of exposure start, the row scanning circuit 210 supplies the high level reset signal to the reset drain and the reset gate and the drain of the detection transistor 232 over a pulse period. Even when such driving is performed, the detection transistor 232 operates in a saturation region at least at the time of resetting, and thereby, even if the drain voltage is changed, the channel potential does not change and the drain current does not change. For this reason, at the time of resetting, the electric charge accumulation portion 233 is reset efficiently, but unnecessary electric current does not leak from the channel of the detection transistor 232 to the reset drain.

Although the N-type transistor is provided as the reset transistor 231 and the detection transistor 232, a P-type transistor may be provided as the reset transistor 231 and the detection transistor 232. Also, although the JFET is provided as the detection transistor 232, a MOSFET may be provided as the detection transistor 232.

[Configuration Example of Sense Circuit]

Figure 4:
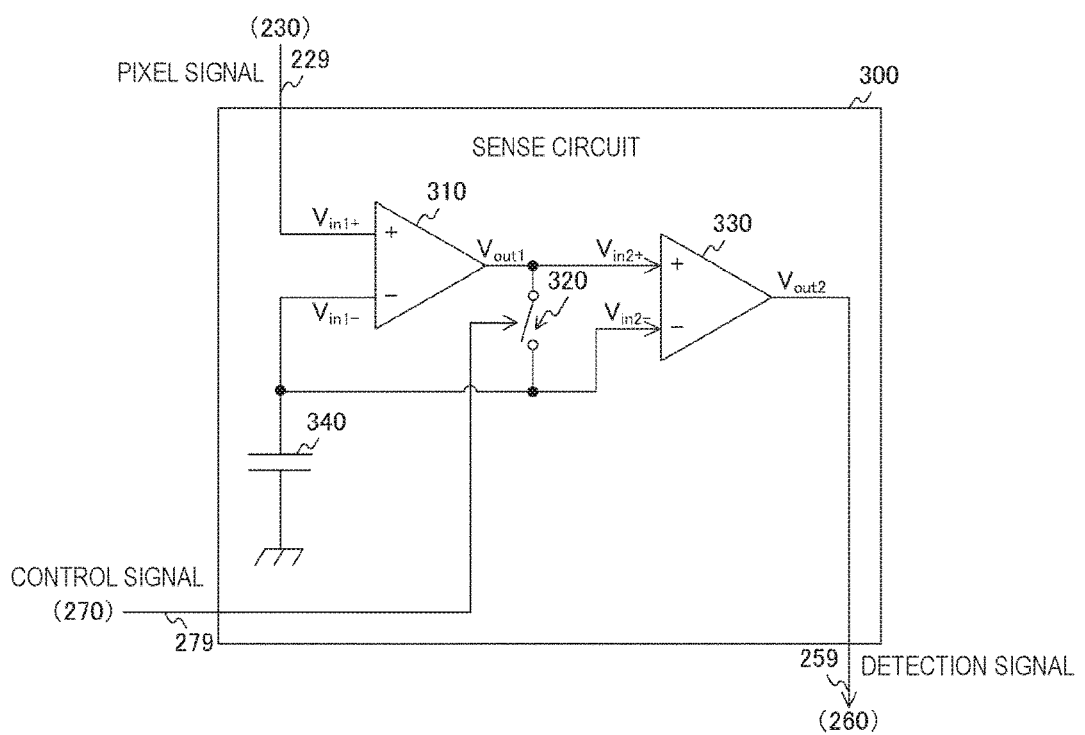
FIG. 4 is a circuit diagram illustrating an example of a sense circuit in the first embodiment.

FIG. 4 is a circuit diagram illustrating an example of the sense circuit 300 in the first embodiment. This sense circuit 300 includes an amplification comparator 310, a switch 320, a detection comparator 330, and a capacitor 340. The non-inverting input terminal (+) of the amplification comparator 310 is connected to the pixel circuit 230, and the inverting input terminal (−) is connected to the capacitor 340. Also, the output terminal of the amplification comparator 310 is connected to the switch 320 and the non-inverting input terminal (+) of the detection comparator 330. Also, the inverting input terminal (−) of the detection comparator 330 is connected to the switch 320 and the capacitor 340.

The amplification comparator 310 amplifies a voltage difference between the non-inverting input terminal (+) and the inverting input terminal (−). This amplification comparator 310 generates a voltage corresponding to the amplified voltage difference as the output voltage Vout1. This output voltage Vout1 is expressed by the following equation, for example. Note that the output voltage Vout1 is an example of the comparison target voltage described in the claims.

$$Vout1 = (Vin1 + -Vin1 - +Vofs1) \times G1 + Vrst + Vofs1 \quad \text{Equation 1}$$

In the above equation, Vin1+ is the voltage of the non-inverting input terminal (+) of the amplification comparator 310, and Vin1− is the voltage of the inverting input terminal (−) of the amplification comparator 310. Also, Vofs1 is an input offset voltage of the amplification comparator 310, and G1 is a gain.

Into the non-inverting input terminal (+) of the amplification comparator 310, the reset voltage Vrst is input as Vin1+ when no photon is incident, and the signal voltage Vsig is input as Vin1+ when a photon is incident. Note that Vin1+ is an example of the input voltage described in the claims.

Here, the gain G1 is 50 for example, and Vofs1 is approximately 0.001 V for example. Also, the reset voltage Vrst is approximately 1 volt (V), for example. Also, a voltage that is approximately equal to the reset voltage Vrst, for example 1 volt (V), is set to Vfix 1. Also, assuming that the conversion efficiency for converting electric charge to voltage in the pixel circuit 230 is 1 mV/e−, the signal voltage Vsig is a value that is lower than the reset voltage Vrst by 0.001 volt (V), for example. Also, the product variation of the threshold voltage of the detection transistor 232 is approximately 0.1 volt (V), and thus the variation amount of the direct current bias value of Vin1+ is approximately 0.1 volt (V).

As described above, the sense circuit 300 needs to determine voltage change of 0.001 volt (V) of Vin1+ indicating presence or absence of one electron, under the condition that the variation of the direct current bias value is approximately 0.1 volt (V). For this reason, Vin1− of the comparison target is unable to be set as a fixed voltage. Therefore, the sense circuit 300 employs a self-reference method described later.

The switch 320 causes the capacitor 340 to retain the reset voltage Vrst+ input offset voltage Vofs1 immediately after resetting of the pixel circuit 230. In accordance with the control signal from the control circuit 270, this switch 320 short-circuits between the inverting input terminal (−) of the amplification comparator 310 and the output terminal of the amplification comparator 310, over the pulse period immediately after the resetting of the pixel circuit 230. In this way, the reset voltage Vrst+ the input offset voltage Vofs1 is retained in the capacitor 340, by the control of the self-reference method which causes the amplification comparator 310 to refer to its own output terminal.

When the pulse period has elapsed, the switch 320 disconnects the terminals to quit the short-circuiting. When the short-circuiting is quitted, the amplification comparator 310 amplifies the difference between Vin1+(Vrst or Vsig) from the pixel circuit 230 and Vin1− (=Vrst+Vofs1) retained in the capacitor. According to equation 1, when a photon is incident, the voltage Vout1 at the output terminal of the amplification comparator 310 decreases by the amount (e.g., 0.005 V) obtained by amplifying the voltage difference between the reset voltage Vrst and the signal voltage Vsig with the gain G1. Note that the switch 320 is an example of the control unit described in the claims.

The capacitor 340 retains the voltage in accordance with the control of the switch 320.

The detection comparator 330 compares the output voltage Vout1 with the retained voltage of the capacitor 340, and outputs the comparison result as a detection signal indicating detected presence or absence of a photon. The voltage Vout2 of this detection signal is expressed by the following equation, for example.

$$Vout2 = (Vin2 + -Vin2 - +Vofs2) \times G2 + Vfix \quad \text{Equation 2}$$

In the above equation, Vin2+ is the voltage of the non-inverting input terminal (+) of the detection comparator 320, and Vin1− is the voltage of the inverting input terminal (−) of the detection comparator 330. Also, Vofs2 is the input offset voltage of the detection comparator 330, and G2 is a gain. Vfix is a predetermined fixed voltage, and is 1 volt (V) for example. Although the gains G1 and G2 are the same value, the gains G1 and G2 may be different values.

Here, the value of the input offset voltage Vofs2 is 0.025±0.001 (V), for example. In this input offset voltage, ±0.001 volt (V) is an offset component caused by product variation, and 0.025 V is an offset component that is added intentionally by adjusting the threshold voltage, gate width, etc. of the differential transistor described later. The former offset component is hereinafter referred to as "variation offset component", and the latter offset component is hereinafter referred to as "adjustment offset component". It is desirable that the adjustment offset component have a larger absolute value than the expected variation offset component. Also, it is desirable that the adjustment offset component be smaller than the value (for example, 0.05 V) obtained by amplifying the absolute value of the voltage difference between the reset voltage Vrst and the signal voltage Vsig with the gain G1. Also, it is more desirable that the adjustment offset component be a value (for example, 0.025 V) that is approximately equal to a half of the value obtained by amplifying the absolute value of the voltage difference between the reset voltage Vrst and the signal voltage Vsig with the gain G1.

In an ideal state where the variation amount of the direct current bias value and the input offset (Vofs1 and Vofs2) are "0", the detection signal becomes high level according to equation 2 when a photon is not incident. However, there is the input offset voltage Vofs1 and the like in an actual circuit, and thus, if there is no adjustment offset component, there is a possibility that the detection signal becomes low level even though a photon is not incident. On the other hand, if the adjustment offset component is set, (Vin2+−Vin2−+Vofs2) becomes larger than "0" when a photon is not incident even if there is the input offset voltage Vofs1 or the like, and thus the sense circuit 300 can output a high level detection signal.

Also, the adjustment offset component is smaller than the absolute value of the voltage difference (Vin2+−Vin2−) (for example, 0.05 V). Therefore, when the voltage difference (Vin2+−Vin2−) becomes lower than the input offset voltage Vofs2 due to the incidence of a photon, the sense circuit 300 can output a low level detection signal according to equation 2. In this manner, the sense circuit 300 can output a detection signal whose value is inverted in accordance with the presence or absence of incidence of a photon, by setting the adjustment offset component.

Figure 5:
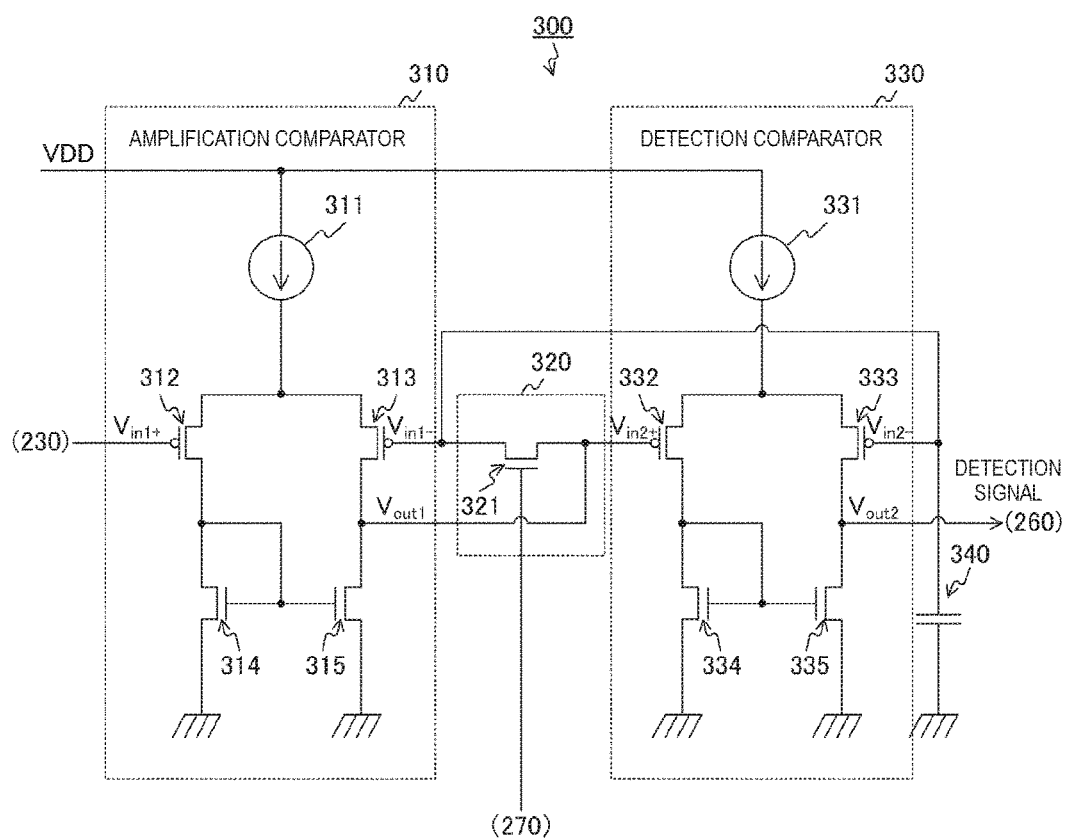
FIG. 5 is a circuit diagram illustrating an example of an amplification comparator and a detection comparator in the first embodiment.

FIG. 5 is a circuit diagram illustrating an example of the amplification comparator 310 and the detection comparator 330 in the first embodiment. The amplification comparator 310 includes a constant current source 311, differential transistors 312 and 313, and MOS transistors 314 and 315. As differential transistors 312 and 313, metal-oxide-semiconductor (MOS) transistors whose channels are P type are provided. The reason of the P type is that the differential transistor 313 needs to be operated in the saturation region. Also, as the MOS transistors 314 and 315, transistors whose channels are N type are provided.

The gate of the differential transistor 312 is connected to the non-inverting input terminal (+), and the drain is connected to the gate and drain of the MOS transistor 314 and the gate of the MOS transistor 315. On the other hand, the gate of the differential transistor 313 is connected to the inverting input terminal (−), and the drain is connected to the drain of the MOS transistor 315 and the output terminal. Also, the sources of the differential transistors 312 and 313 are connected to the constant current source 311. Also, the gate and the drain of the MOS transistor 314 are connected to the gate of the MOS transistor 315 and the drain of the differential transistor 312, and the ground potential is applied to the source. The gate of the MOS transistor 315 is connected to the gate and drain of the MOS transistor 314 and the drain of the differential transistor 312, and the drain is connected to the drain of the differential transistor 313 and the output terminal, and the ground potential is applied to the source.

With this configuration, the differential transistors 312 and 313 can amplify the voltage difference between the input terminals.

Also, the switch 320 includes an N-type MOS transistor 321, for example. The gate of this MOS transistor 321 is connected to the control circuit 270, and the source is connected to the non-inverting input terminal (+) of the detection comparator 330, and the drain is connected to the inverting input terminal (−) of the amplification comparator 310 and the capacitor 340.

The detection comparator 330 includes a constant current source 331, differential transistors 332 and 333, and MOS transistors 334 and 335. P-type MOS transistors are provided as the differential transistors 332 and 333, and N-type transistors are provided as the MOS transistors 334 and 335.

The connection configuration between the constant current source 331, the differential transistors 332 and 333, and the MOS transistors 334 and 335 is the same as the constant current source 311, the differential transistors 312 and 313, and the MOS transistors 314 and 315. However, the adjustment offset component is provided by setting a relative difference between the differential transistors 332 and 333, in at least one of the threshold voltage, the gate width, the gate length, and the film thickness of the gate oxide film of the differential transistors 332 and 333. These differential transistors 332 and 333 are transistors of the same shape arranged at the shortest distance in the sense circuit 300. Therefore, the offset component of approximately 0.025 volt (V) can be set with sufficiently high accuracy, by setting a relative difference to at least one of the threshold voltage, the gate width, the gate length, and the film thickness of the gate oxide film of the differential transistors 332 and 333. Here, the gate width is the length of the gate in the direction orthogonal to the direction from the source to the drain, and the gate length is the length of the gate in the direction from the source to the drain.

For example, as the threshold voltage of the differential transistor 332 of the non-inverting input terminal (+) side is made smaller than the threshold voltage of the inverting input terminal (−) side by differentiating the dose amount of the threshold adjustment ion implantation, the adjustment offset component becomes larger. Also, as the gate width of the differential transistor 332 of the non-inverting input terminal (+) side is made smaller than the gate width of the inverting input terminal (−) side, the adjustment offset component becomes larger. Also, as the gate length of the differential transistor 332 of the non-inverting input terminal (+) side is made larger than the gate length of the inverting input terminal (−) side, the adjustment offset component becomes larger. Also, when the differential transistors 332 and 333 are enhancement type, as the film thickness of the differential transistor 332 of the non-inverting input terminal (+) side is made thicker than the film thickness of the inverting input terminal (−) side, the adjustment offset component becomes larger. On the other hand, when the differential transistors 332 and 333 are depletion type, as the film thickness of the differential transistor 332 of the non-inverting input terminal (+) side is made thinner than the film thickness of the inverting input terminal (−) side, the adjustment offset component becomes larger.

Although the differential transistors (such as 312 and 313) are P type, the differential transistors may be N type. When the signal electric charge output by the photoelectric conversion portion 234 is not electrons but holes, the signal voltage Vsig at the time of photon incidence is higher than the reset voltage Vrst at the time of no incidence, but in this case the dynamic range can be set wider with the N-type differential transistor.

[Operation Example of Image Sensor]

Figure 6:
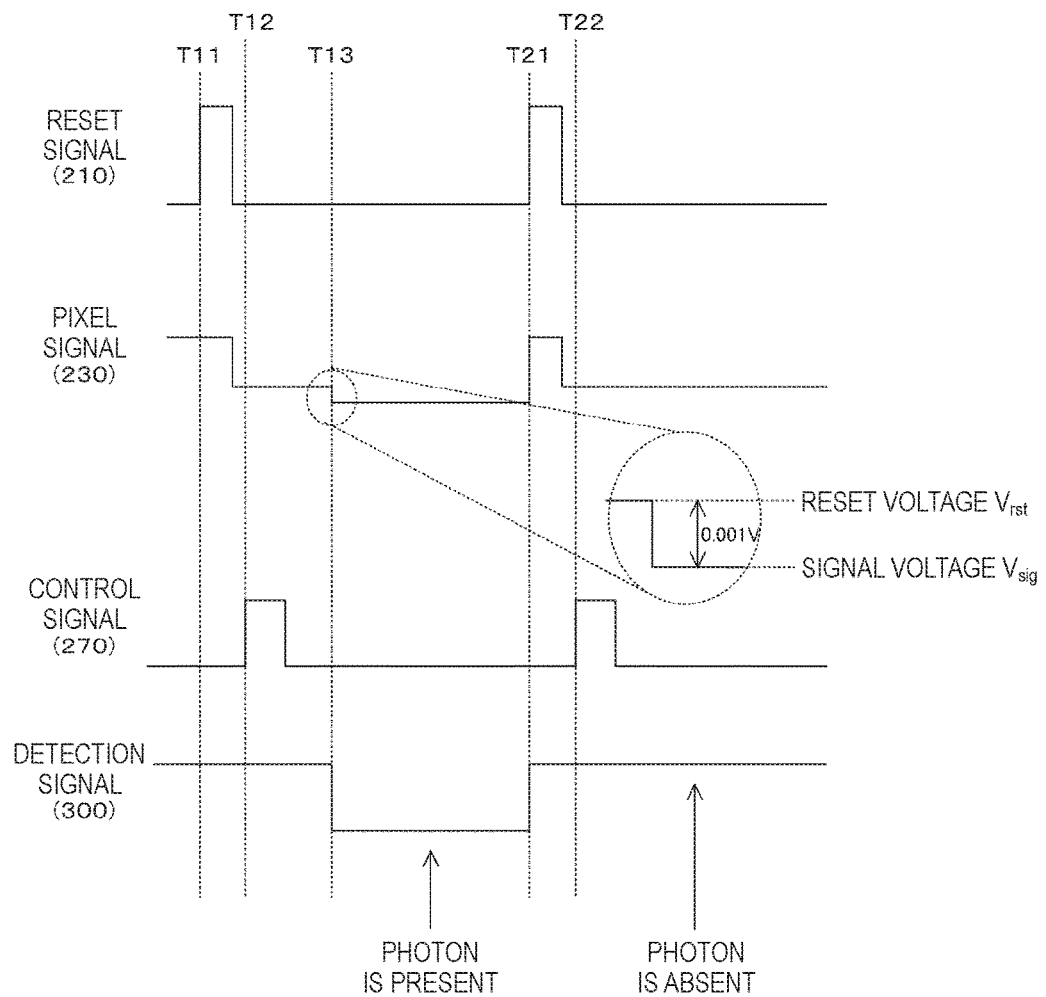
FIG. 6 is a timing chart illustrating an example of operation of an image sensor in the first embodiment.

FIG. 6 is a timing chart illustrating an example of the operation of the image sensor 200 in the first embodiment. At a timing T11 immediately before the light exposure period of the pixel circuit 230, the row scanning circuit 210 sets the reset signal to high level for the pixel circuit 230, and sets the reset signal to low level when the pulse period elapses. By this control, the pixel circuit 230 is reset, and the reset voltage Vrst at the time of no photon incidence is output.

Also, the control circuit 270 sets the control signal to high level at a timing T12 immediately after the resetting, and sets the control signal to low level when the pulse period elapses. By this control, the reset voltage Vrst+ the input offset voltage Vofs1 is retained in the capacitor 340. When a photon is incident at a subsequent timing T13, the level of the pixel signal of the pixel circuit 230 lowers by 0.001 volt (V) from the reset voltage Vrst, due to photoelectrically converted electrons. The sense circuit 300 detects this voltage difference and outputs a low level detection signal indicating the presence of a photon.

On the other hand, at timings T21 and T22, if a photon is not incident after the reset and retaining of the reset voltage and the like are performed, the level of the pixel signal remains the reset voltage Vrst. Therefore, the sense circuit 300 outputs a high level detection signal indicating the absence of a photon.

FIG. 7 is a diagram illustrating an example of the input and output voltages of the amplification comparator and the detection comparator in the first embodiment. When the control signal is controlled to a high level immediately after resetting of the pixel circuit 230, the retained voltage of Vrst+Vofs1 is retained in the capacitor 340. Then, when a photon is not incident with the control signal being controlled to a low level, the pixel signal of the reset voltage Vrst is input, and the amplification comparator 310 outputs Vout1 of 1 volt (V) according to equation 1, for example. On the other hand, when a photon is incident, Vout1 fluctuates by an amount corresponding to amplification of the voltage difference between the reset voltage Vrst and the signal voltage Vsig, and 0.95 volt (V) is output, for example.

Also, when a photon is not incident, the retained voltage (Vrst+Vofs1) of approximately 1 volt is input into the non-inverting input terminal (+) and the inverting input terminal (−) of the detection comparator 330. A sufficiently large voltage (0.025 V±0.001 V, etc.) is set as the input offset voltage Vofs2, and thereby the detection comparator 330 outputs a high level detection signal. For example, if the gain G2 is 50, the detection signal of approximately 2.25 V±0.05 V (V) is output according to the equation 2, but actually the detection signal is regulated within the dynamic range of the output level, and when the power supply voltage is approximately 2.25 V±0.05 volt (V) or less for example, the detection signal becomes the power supply voltage.

On the other hand, when a photon is incident, Vout1 of 0.95 volt (V) and the retained voltage (Vrst+Vofs1) around approximately 1 volt are input into the detection comparator 330. The input offset voltage Vofs2 is smaller than a value (0.05 V, etc.) obtained by amplifying the absolute value of the voltage difference, the detection comparator 330 outputs a low level detection signal. For example, if the input offset voltage Vofs2 is 0.025 V and the gain G2 is 50, the detection signal of approximately −0.25 V±0.05 V (V) is output according to the equation 2, but actually the detection signal is regulated within the dynamic range of the output level, and the detection signal becomes the ground potential for example.

As described above, according to the embodiment of the present technology, the sense circuit 300 amplifies the voltage difference between the input voltage and the retained voltage of the capacitor, and generates a detection signal indicating whether or not the amplified voltage difference is higher than a predetermined value, and thereby presence or absence of a photon can be accurately detected with a simple configuration.

2. Second Embodiment

In the first embodiment, the amplification comparator 310 and the detection comparator 330 output the respective output voltages Vout1 and Vout2 as they are, but the output voltages may be output via buffer amplifiers as necessary. The sense circuit 300 of the second embodiment is different from the first embodiment in that the output voltages Vout1 and Vout2 are output via buffer amplifiers.

Figure 8:
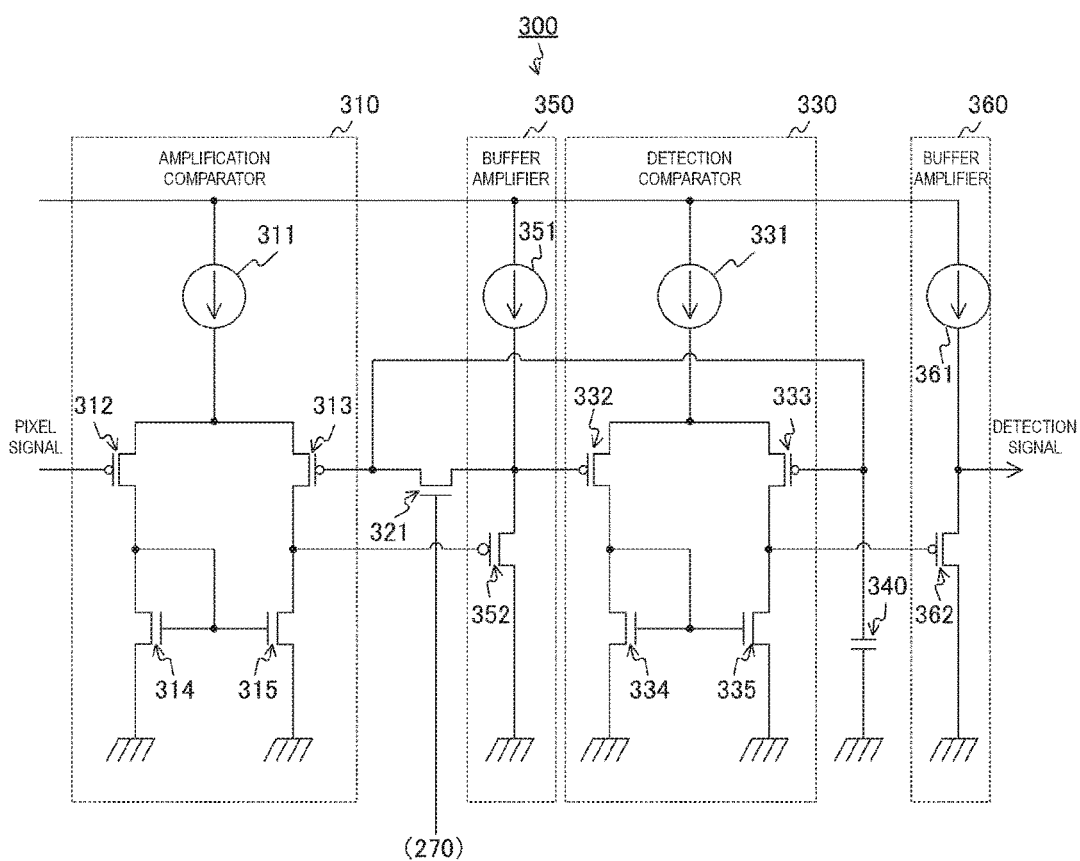
FIG. 8 is a circuit diagram illustrating an example of a sense circuit in a second embodiment.
Figure 9:
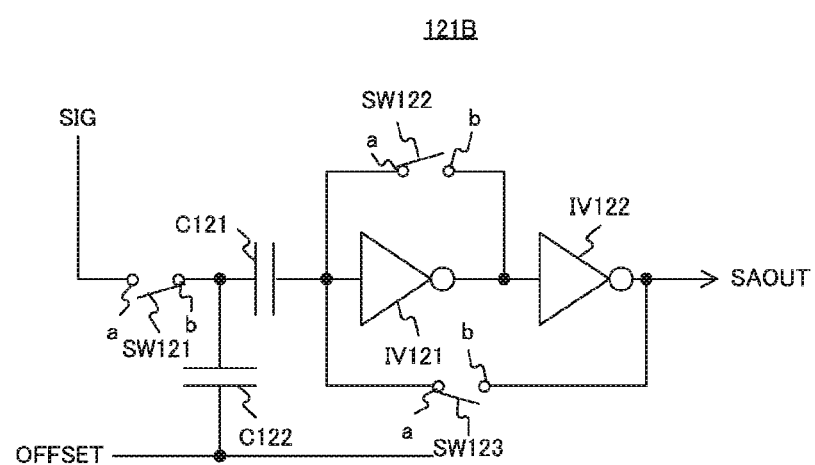
FIG. 9 is a circuit diagram illustrating a sense circuit in the prior art.

FIG. 8 is a circuit diagram illustrating an example of the sense circuit 300 in the second embodiment. This sense circuit 300 is different from the first embodiment in that the sense circuit 300 further includes buffer amplifiers 350 and 360. The buffer amplifier 350 includes a constant current source 351 and a MOS transistor 352. Also, the buffer amplifier 360 includes a constant current source 361 and a MOS transistor 362. P-type transistors are provided as the MOS transistors 352 and 362, for example.

The gate of the MOS transistor 352 is connected to the output terminal of the amplification comparator 310, and the source is connected to the constant current source 351, the source of the MOS transistor 321, and the gate of the differential transistor 332, and the ground potential is applied to the drain. Also, the gate of the MOS transistor 362 is connected to the output terminal of the detection comparator 330, and the source is connected to the constant current source 361 and the output terminal of the sense circuit 300, and the ground potential is applied to the drain.

With this configuration, the buffer amplifier 350 expands the dynamic range of the differential transistor 313 of the inverting input terminal (−) side of the amplification comparator 310 and performs impedance conversion of the voltage of the output terminal. Also, the buffer amplifier 360 performs impedance conversion of the voltage of the output terminal of the detection comparator 330. Thereby, the characteristics of the image sensor 200 can be further improved. Note that the buffer amplifier 350 is an example of the first buffer amplifier described in the claims, and the buffer amplifier 360 is an example of the second buffer amplifier described in the claims.

Although both the buffer amplifiers 350 and 360 are provided in the sense circuit 300, only one of the buffer amplifiers 350 and 360 may be provided.

As described above, according to the second embodiment, the dynamic range of the differential transistor 313 of the inverting input terminal (−) side of the amplification comparator 310 is expanded, and the impedance of the output terminal of the amplification comparator 310 is reduced. In addition to this, the impedance of the output terminal of the detection comparator 330 is reduced, and thereby the characteristics of the image sensor 200 can be improved.

The above-described embodiments are examples for embodying the present technology, and matters in the embodiments each have a corresponding relationship with disclosure-specific matters in the claims. Likewise, the matters in the embodiments and the disclosure-specific matters in the claims denoted by the same names have a corresponding relationship with each other. However, the present technology is not limited to the embodiments, and various modifications of the embodiments may be embodied in the scope of the present technology without departing from the spirit of the present technology.

In addition, the effects described in the present specification are not limiting but are merely examples, and there may be additional effects.

Additionally, the present technology may also be configured as below.

(1)

An image sensor including:

a pixel circuit that generates as an input voltage a signal voltage by photoelectrically converting light when the light is incident, and generates as the input voltage a predetermined reset voltage when light is not incident;

a capacitor that retains the predetermined reset voltage as a retained voltage;

an amplification comparator that amplifies a voltage difference between the input voltage and the retained voltage; and a detection comparator that outputs a result of determining whether or not the amplified voltage difference is higher than a predetermined value, as a detection signal indicating detected presence or absence of light incidence.

(2)

The image sensor according to (1), further including:

a control unit that causes the capacitor to retain the predetermined reset voltage when light is not incident.

(3)

The image sensor according to (2), wherein the amplification comparator amplifies a voltage difference between terminal voltages of a pixel circuit side input terminal connected to the pixel circuit and a capacitor side input terminal connected to the capacitor, and outputs a voltage corresponding to the amplified voltage difference from an output terminal, and the control unit causes the capacitor to retain the predetermined reset voltage by interterminal short-circuiting of the capacitor side input terminal and the output terminal.

(4)

The image sensor according to any of (1) to (3), wherein the amplification comparator amplifies the voltage difference between the input voltage and the retained voltage to generate a comparison target voltage corresponding to the amplified voltage difference, and the detection comparator amplifies a voltage obtained by adding a predetermined input offset voltage to a voltage difference between the retained voltage and the comparison target voltage and outputs the amplified voltage as the detection signal.

(5)

The image sensor according to (4), wherein the amplification comparator amplifies the voltage difference between the input voltage and the retained voltage with a predetermined gain, and the input offset voltage is approximately equal to a half of a value obtained by amplifying a voltage difference between the reset voltage and the signal voltage with the predetermined gain.

(6)

The image sensor according to (4) or (5), wherein the detection comparator includes a pair of differential transistors that amplify the voltage obtained by adding the predetermined input offset voltage to the voltage difference between the retained voltage and the comparison target voltage.

(7)

The image sensor according to (6), wherein the input offset voltage includes an adjustment offset component corresponding to a difference between threshold voltages of the pair of differential transistors.

(8)

The image sensor according to (6) or (7), wherein the input offset voltage includes an adjustment offset component corresponding to a difference between gate widths of the pair of differential transistors.

(9)

The image sensor according to any of (6) to (8), wherein the input offset voltage includes an adjustment offset component corresponding to a difference between gate lengths of the pair of differential transistors.

(10)

The image sensor according to any of (6) to (9), wherein the input offset voltage includes an adjustment offset component corresponding to a difference between film thicknesses of gate oxide films of the pair of differential transistors.

(11)

The image sensor according to any of (1) to (10), wherein the amplification comparator is provided with a pair of differential transistors connected to a pixel circuit side input terminal connected to the pixel circuit and a capacitor side input terminal connected to the capacitor, and the image sensor further includes a first buffer amplifier that expands a dynamic range of the differential transistor connected to the capacitor side input terminal and reduces an impedance of an output terminal of the amplification comparator.

(12)

The image sensor according to any of (1) to (11), further including a second buffer amplifier that reduces an impedance of an output terminal of the detection comparator.

(13)

An imaging apparatus including:

a pixel circuit that generates as an input voltage a signal voltage by photoelectrically converting light when the light is incident, and generates as the input voltage a predetermined reset voltage when light is not incident;

a capacitor that retains the predetermined reset voltage as a retained voltage;

an amplification comparator that amplifies a voltage difference between the input voltage and the retained voltage;

a detection comparator that outputs a result of determining whether or not the amplified voltage difference is higher than a predetermined value, as a detection signal indicating detected presence or absence of light incidence; and a signal processing circuit that processes the detection signal.

REFERENCE SIGNS LIST 100 imaging apparatus
110 lens
120 signal processing circuit
130 drive circuit
200 image sensor
210 row scanning circuit
220 pixel array unit
230 pixel circuit
231 reset transistor
232 detection transistor
233 electric charge accumulation portion
234 photoelectric conversion portion
240, 311, 331, 351, 361 constant current source
250 sense circuit unit
260 determination result integration circuit unit
261, 265 determination result integration circuit
262, 266 register
263, 267 count circuit
264, 268 memory
270 control circuit
300 sense circuit
310 amplification comparator
312, 313, 332, 333 differential transistor
314, 315, 321, 334, 335, 352, 362 MOS transistor
320 switch
330 detection comparator
340 capacitor
350, 360 buffer amplifier

The invention claimed is:

1. An image sensor, comprising:

a pixel circuit configured to:

generate as an input voltage, a signal voltage by photoelectric conversion of light when the light is incident; and generate as the input voltage, a reset voltage when the light is absent;

a capacitor configured to retain the reset voltage as a retained voltage;

an amplification comparator configured to amplify a first voltage difference between the input voltage and the retained voltage, for generation of a comparison target voltage; and a detection comparator configured to:
  output a result of a determination that the amplified first voltage difference is higher than a value, as a detection signal indicating one of detected presence of the incident light or absence of the light;
  amplify a first voltage obtained by an addition of an input offset voltage to a second voltage difference between the retained voltage and the comparison target voltage; and
  output the amplified first voltage as the detection signal.

2. The image sensor according to claim 1, further comprising:
a control unit configured to control the capacitor to retain the reset voltage when the light is absent.

3. The image sensor according to claim 2,
wherein the amplification comparator is further configured to:
  amplify a third voltage difference between terminal voltages of a pixel circuit side input terminal connected to the pixel circuit and a capacitor side input terminal connected to the capacitor, and
  output a second voltage corresponding to the amplified third voltage difference from an output terminal, and
wherein the control unit is further configured to control the capacitor to retain the reset voltage by interterminal short-circuit of the capacitor side input terminal and the output terminal.

4. The image sensor according to claim 1,
wherein the amplification comparator is further configured to amplify the first voltage difference between the input voltage and the retained voltage with a again, and
wherein the input offset voltage is approximately equal to a half of a value obtained by an amplification of a third voltage difference between the reset voltage and the signal voltage with the gain.

5. The image sensor according to claim 1,
wherein the detection comparator includes a pair of differential transistors configured to amplify the first voltage obtained by the addition of the input offset voltage to the second voltage difference between the retained voltage and the comparison target voltage.

6. The image sensor according to claim 5,
wherein the input offset voltage includes an adjustment offset component corresponding to a third voltage difference between threshold voltages of the pair of differential transistors.

7. The image sensor according to claim 5,
wherein the input offset voltage includes an adjustment offset component corresponding to a difference between gate widths of the pair of differential transistors.

8. The image sensor according to claim 5,
wherein the input offset voltage includes an adjustment offset component corresponding to a difference between gate lengths of the pair of differential transistors.

9. The image sensor according to claim 5,
wherein the input offset voltage includes an adjustment offset component corresponding to a difference between film thicknesses of gate oxide films of the pair of differential transistors.

10. The image sensor according to claim 1,
wherein the amplification comparator comprises a pair of differential transistors connected to a pixel circuit side input terminal connected to the pixel circuit and a capacitor side input terminal connected to the capacitor,
wherein the image sensor further includes a first buffer amplifier, and
wherein the first buffer amplifier is configured to:
  expand a dynamic range of a differential transistor connected to the capacitor side input terminal, and
  reduce an impedance of an output terminal of the amplification comparator.

11. The image sensor according to claim 1, further comprising
a second buffer amplifier configured to reduce an impedance of an output terminal of the detection comparator.

12. An imaging apparatus, comprising:
a pixel circuit configured to:
  generate as an input voltage, a signal voltage by photoelectric conversion of light when the light is incident; and
  generate as the input voltage, a reset voltage when the light is absent;
a capacitor configured to retain the reset voltage as a retained voltage;
an amplification comparator configured to amplify a first voltage difference between the input voltage and the retained voltage, for generation of a comparison target voltage;
a detection comparator configured to:
  output a result of a determination that the amplified first voltage difference is higher than a value, as a detection signal indicating one of detected presence of the incident light or absence of the light;
  amplify a voltage obtained by an addition of an input offset voltage to a second voltage difference between the retained voltage and the comparison target voltage; and
  output the amplified voltage as the detection signal; and
a signal processing circuit configured to process the detection signal.

* * * * *